US012142457B2

(12) United States Patent
Nishihata et al.

(10) Patent No.: US 12,142,457 B2
(45) Date of Patent: Nov. 12, 2024

(54) CHARGED PARTICLE BEAM DEVICE

(71) Applicant: Hitachi High-Tech Corporation, Tokyo (JP)

(72) Inventors: Takahiro Nishihata, Tokyo (JP); Mayuka Osaki, Tokyo (JP); Yuji Takagi, Tokyo (JP); Takuma Yamamoto, Tokyo (JP); Makoto Suzuki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 318 days.

(21) Appl. No.: 17/771,551

(22) PCT Filed: Oct. 6, 2020

(86) PCT No.: PCT/JP2020/037812
§ 371 (c)(1),
(2) Date: Apr. 25, 2022

(87) PCT Pub. No.: WO2021/085049
PCT Pub. Date: May 6, 2021

(65) Prior Publication Data
US 2022/0367147 A1 Nov. 17, 2022

(30) Foreign Application Priority Data
Oct. 31, 2019 (JP) .................. 2019-199141

(51) Int. Cl.
H01J 37/28 (2006.01)
H01J 37/22 (2006.01)
H01J 37/244 (2006.01)
(52) U.S. Cl.
CPC .......... H01J 37/28 (2013.01); H01J 37/222 (2013.01); H01J 37/244 (2013.01);
(Continued)

(58) Field of Classification Search
CPC .. H01J 37/00; H01J 37/02; H01J 37/26; H01J 37/28; H01J 37/222; H01J 37/244;
(Continued)

(56) References Cited

U.S. PATENT DOCUMENTS 6,593,152 B2    7/2003  Nakasuji
6,646,262 B1   11/2003  Todokoro et al.
(Continued)

FOREIGN PATENT DOCUMENTS

JP    2001357808 A    12/2001
JP    2010092859 A     4/2010
(Continued)

OTHER PUBLICATIONS

Search Report mailed Dec. 8, 2020 in International Application No. PCT/JP2020/037812.
(Continued)

Primary Examiner — Jason L McCormack
(74) Attorney, Agent, or Firm — Miles & Stockbridge, P.C.

(57) ABSTRACT

A charged particle beam device 1 includes: a plurality of detectors 7 for detecting a signal particle 9 emitted from a sample 8 irradiated with a charged particle beam 3 and converting the detected signal particle 9 into an output electrical signal 17; an energy discriminator 14 provided for each detector 7 and configured to discriminate the output electrical signal 17 according to energy of the signal particle 9; a discrimination control block 21 for setting an energy discrimination condition of each of the energy discriminators 14; and an image calculation block 22 for generating an image based on the discriminated electrical signal. The discrimination control block 21 sets energy discrimination conditions different from each other among the plurality of energy discriminators 14.

15 Claims, 10 Drawing Sheets

(52) U.S. Cl.
CPC ............... *H01J 2237/2443* (2013.01); *H01J 2237/24485* (2013.01); *H01J 2237/24495* (2013.01); *H01J 2237/2817* (2013.01)

(58) Field of Classification Search
CPC .... H01J 37/05; H01J 37/22; H01J 2237/2443; H01J 2237/24485; H01J 2237/24495; H01J 2237/2817; H01J 2237/2448
USPC .......................................... 250/306, 307, 311
See application file for complete search history.

(56) References Cited

U.S. PATENT DOCUMENTS

| | | | |
|---|---|---|---|
| 7,244,932 B2 | 7/2007 | Nakasuji | |
| 7,439,500 B2 | 10/2008 | Frosien et al. | |
| 8,450,699 B2 | 5/2013 | Ohshima | |
| 8,946,649 B2 | 2/2015 | Sasaki et al. | |
| 9,384,936 B2 | 7/2016 | Ren et al. | |
| 9,653,255 B2 | 5/2017 | Schubert | |
| 10,643,819 B2 | 5/2020 | Masnaghetti et al. | |
| 2007/0187598 A1 | 8/2007 | Tachibana et al. | |
| 2008/0116375 A1* | 5/2008 | Ikegami | H01J 37/244 250/311 |
| 2010/0084553 A1* | 4/2010 | Frosien | G01T 1/00 250/306 |
| 2012/0298864 A1 | 11/2012 | Morishita et al. | |
| 2013/0032713 A1* | 2/2013 | Barbi | G01T 1/20188 250/311 |
| 2013/0043388 A1 | 2/2013 | Hatano et al. | |
| 2013/0292568 A1* | 11/2013 | Bizen | H01J 37/244 250/311 |
| 2014/0299767 A1 | 10/2014 | Bizen et al. | |
| 2015/0292568 A1* | 10/2015 | Allmandinger | F16D 13/64 192/107 R |
| 2019/0355552 A1 | 11/2019 | Mizutani et al. | |
| 2020/0294756 A1* | 9/2020 | Yokosuka | H01J 37/28 |

FOREIGN PATENT DOCUMENTS

| | | |
|---|---|---|
| JP | 4523558 B2 | 8/2010 |
| JP | 2014203603 A | 10/2014 |
| JP | 5663412 B2 | 2/2015 |
| JP | 2018509741 A | 4/2018 |
| WO | 0175929 A1 | 10/2001 |
| WO | 2011089955 A1 | 7/2011 |
| WO | 2011092757 A1 | 8/2011 |
| WO | 2018173242 A1 | 9/2018 |

OTHER PUBLICATIONS

Written Opinion mailed Dec. 8, 2020 in International Application No. PCT/JP2020/037812.
Office Action mailed Dec. 31, 2021 in U.S. Appl. No. 14/244,802.
Office Action mailed Jul. 2, 2015 in U.S. Appl. No. 14/244,802.
Notice of Allowance mailed Jan. 12, 2016 in U.S. Appl. No. 14/244,802.

* cited by examiner

[FIG. 1]
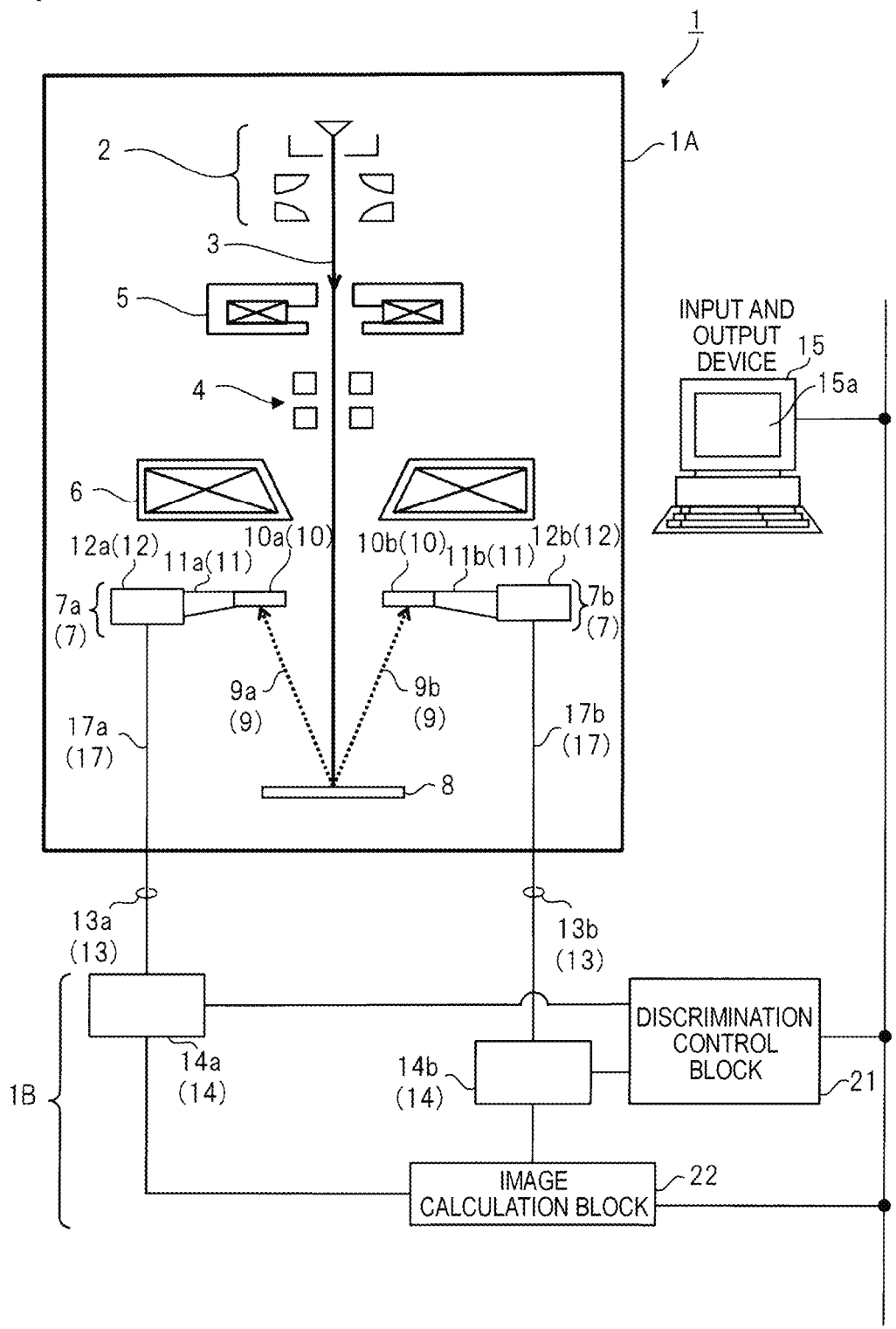

[FIG. 2A]
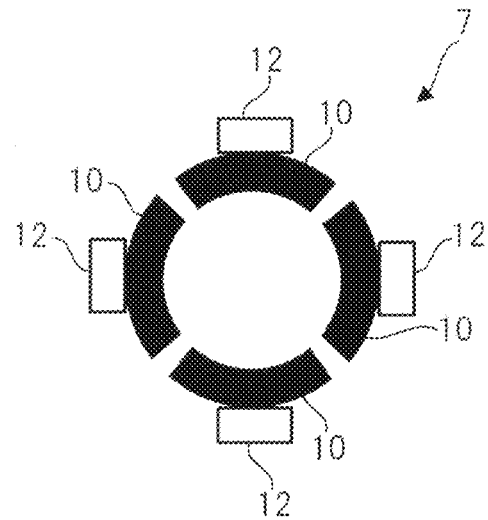
[FIG. 2B]
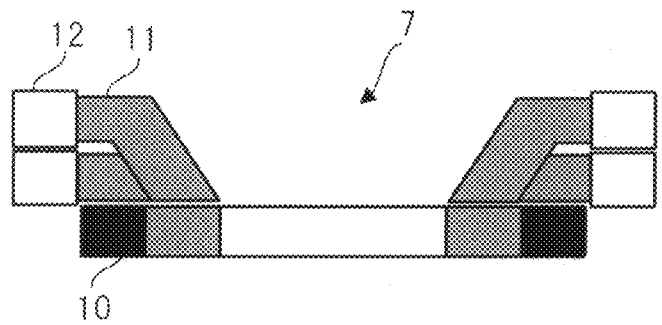
[FIG. 3]
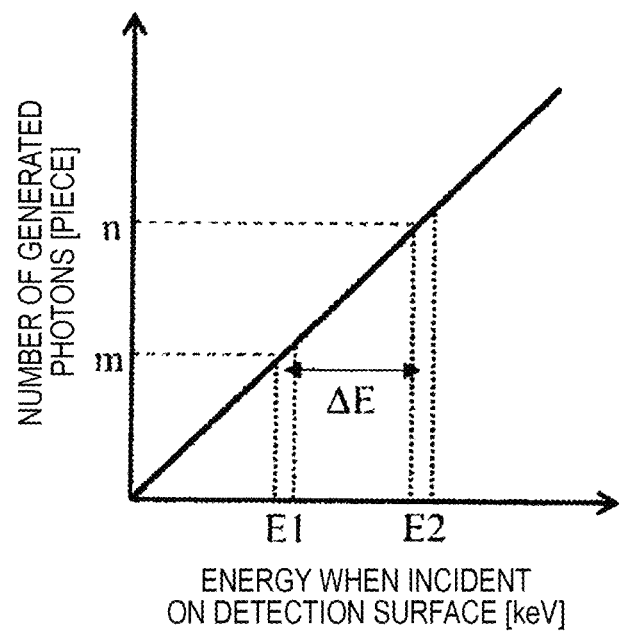

[FIG. 4]
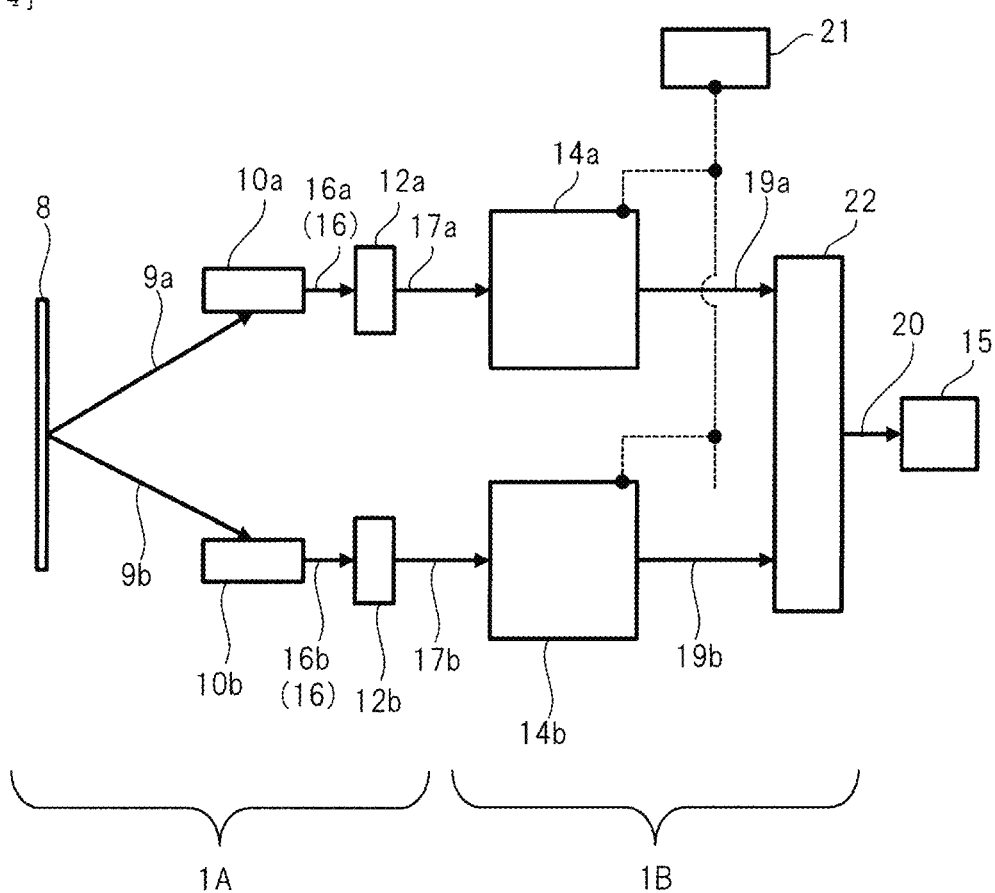

[FIG. 5]
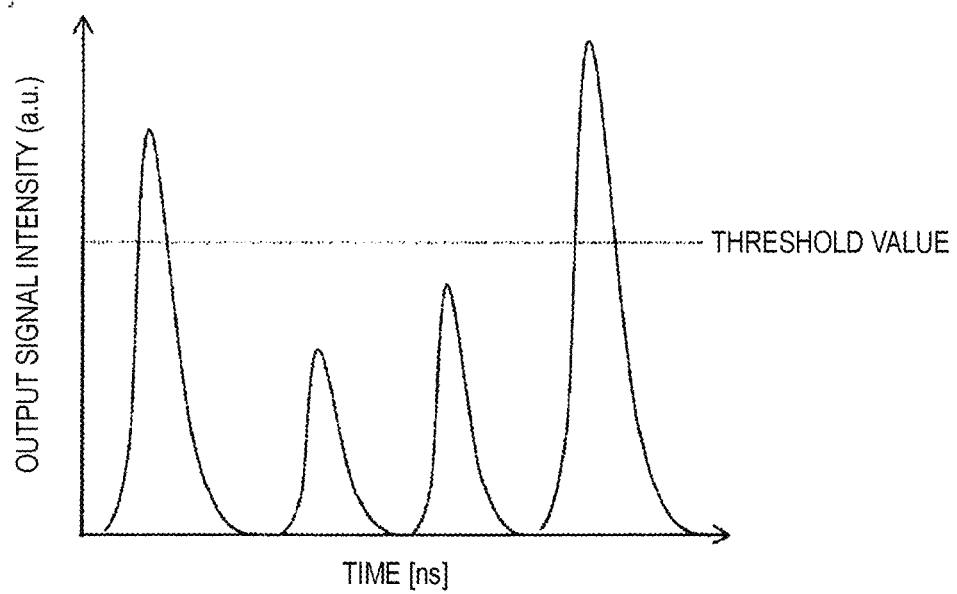
[FIG. 6]
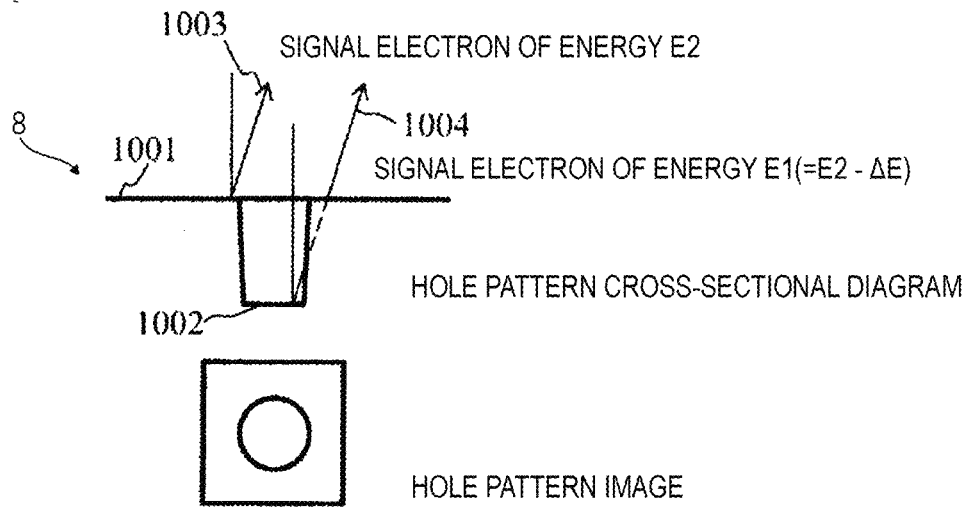

[FIG. 7]
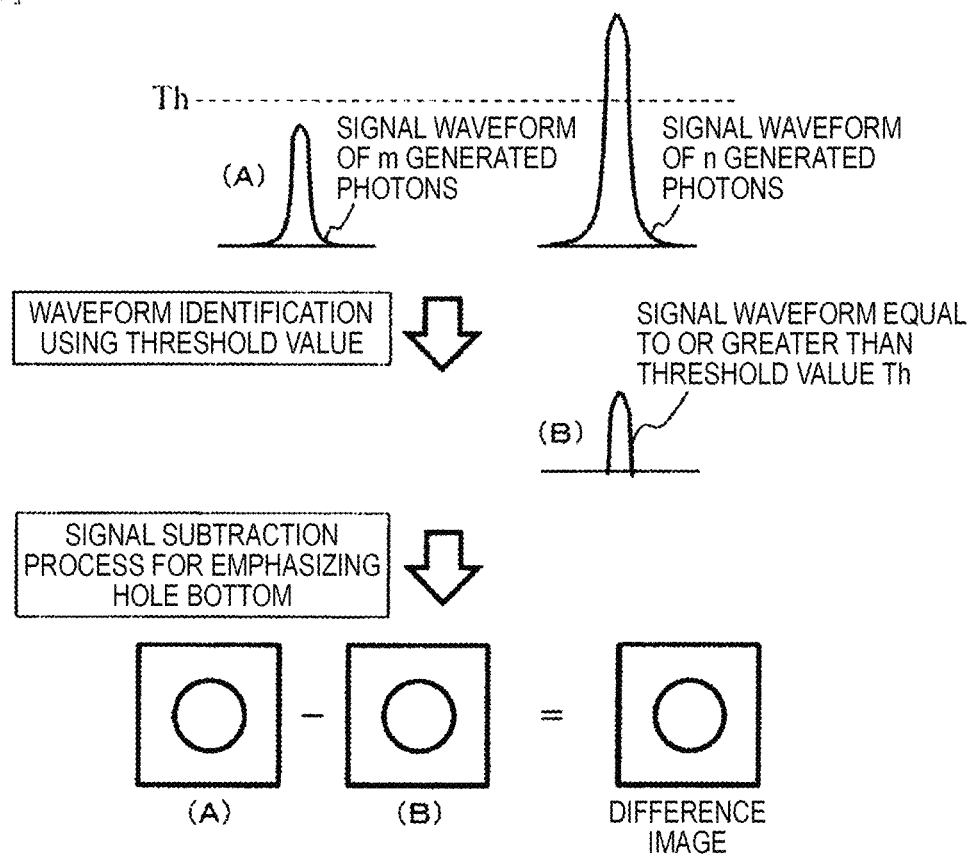

[FIG. 8]
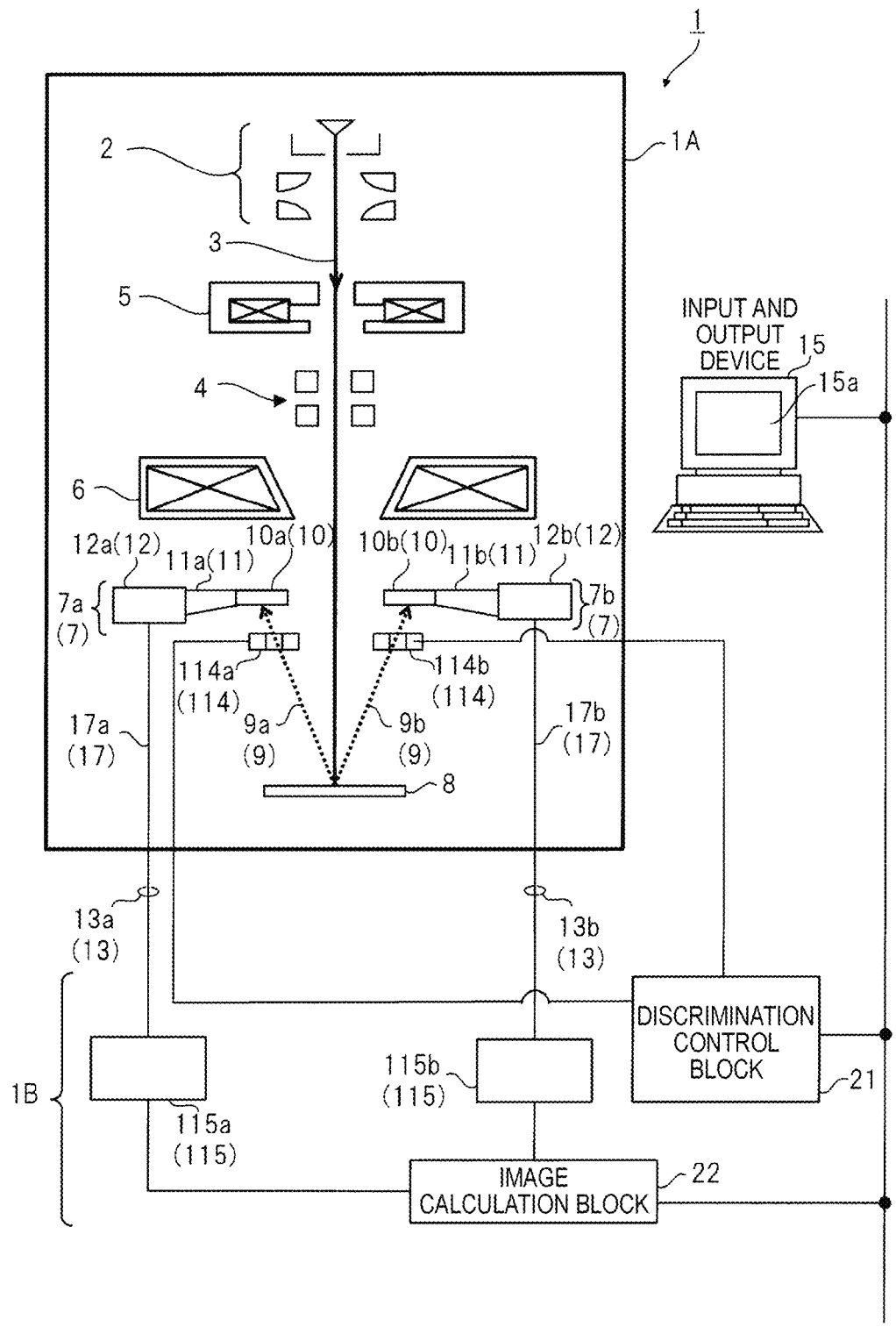

[FIG. 9]
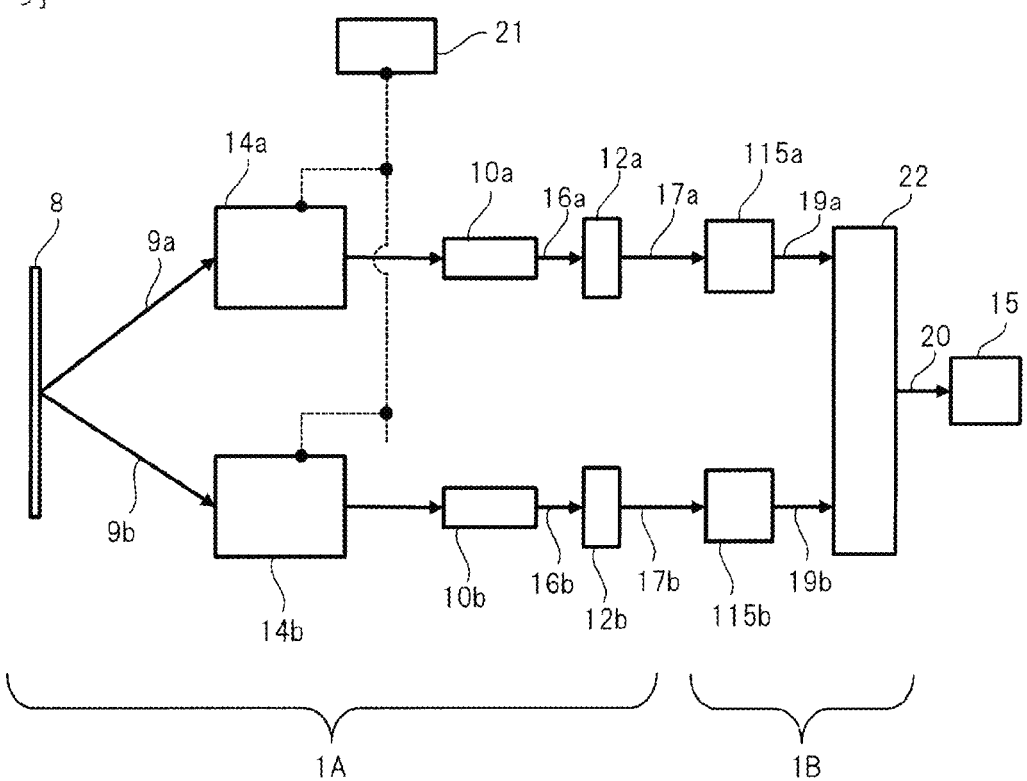

[FIG. 10]
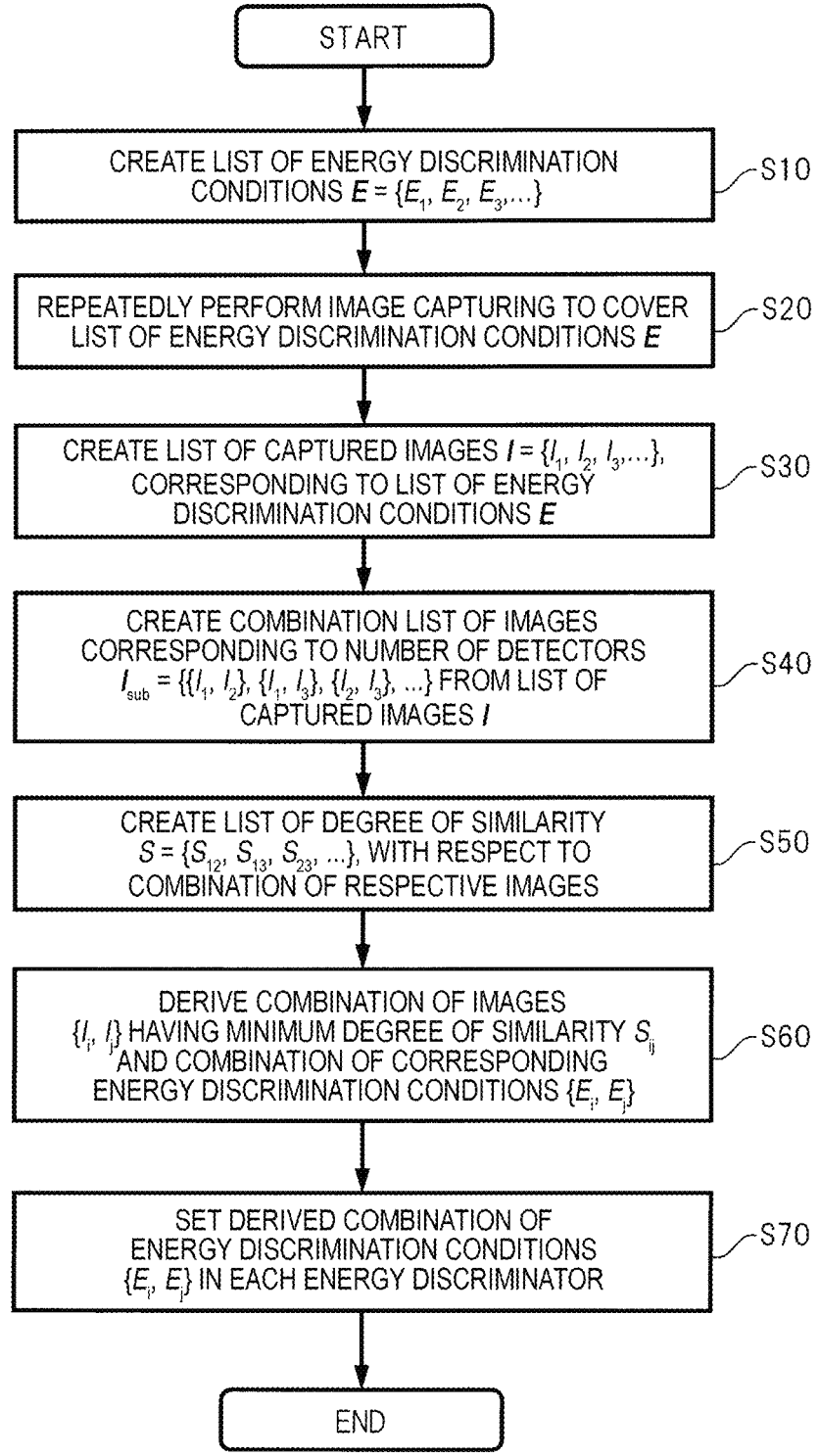

[FIG. 11]
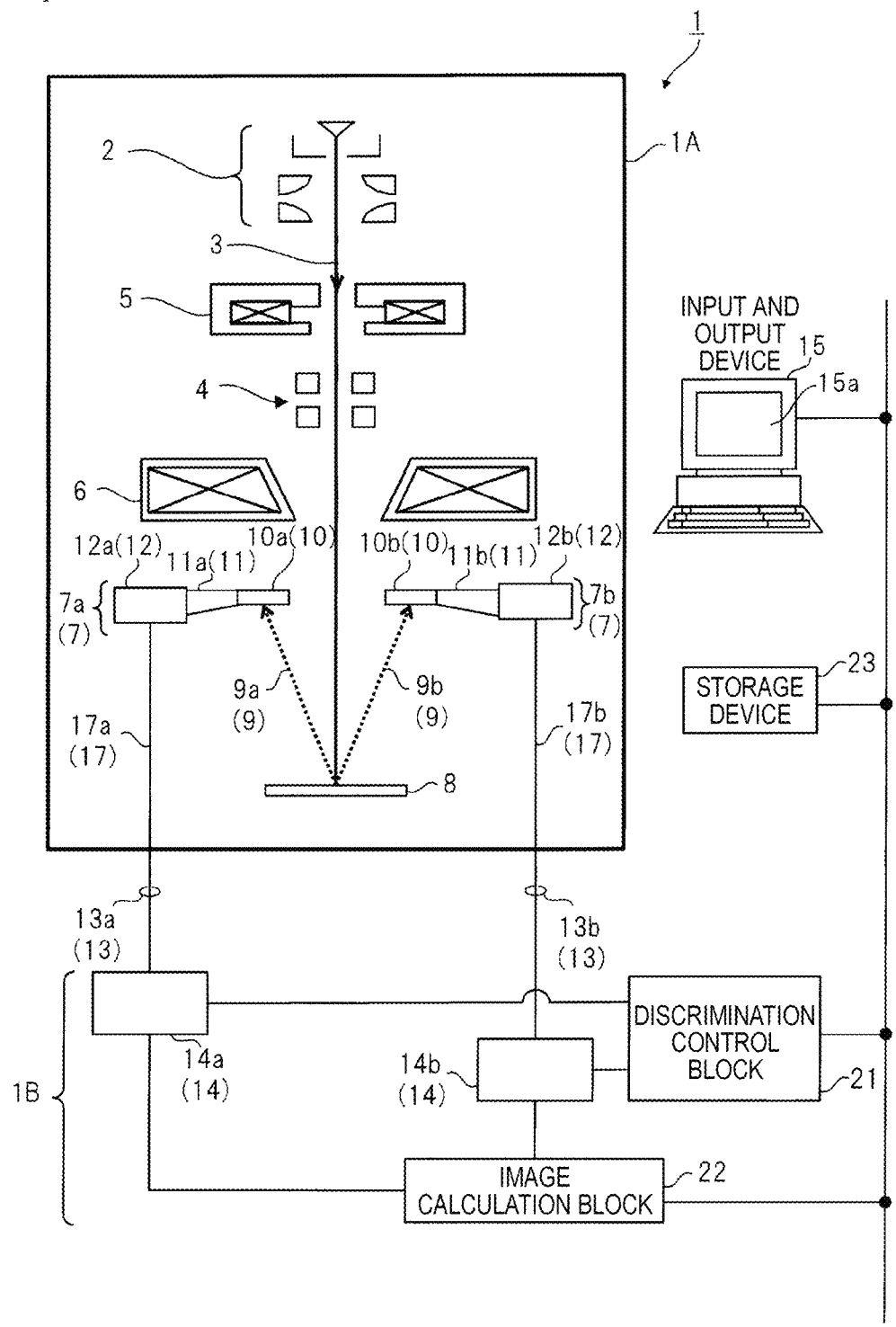

[FIG. 12]
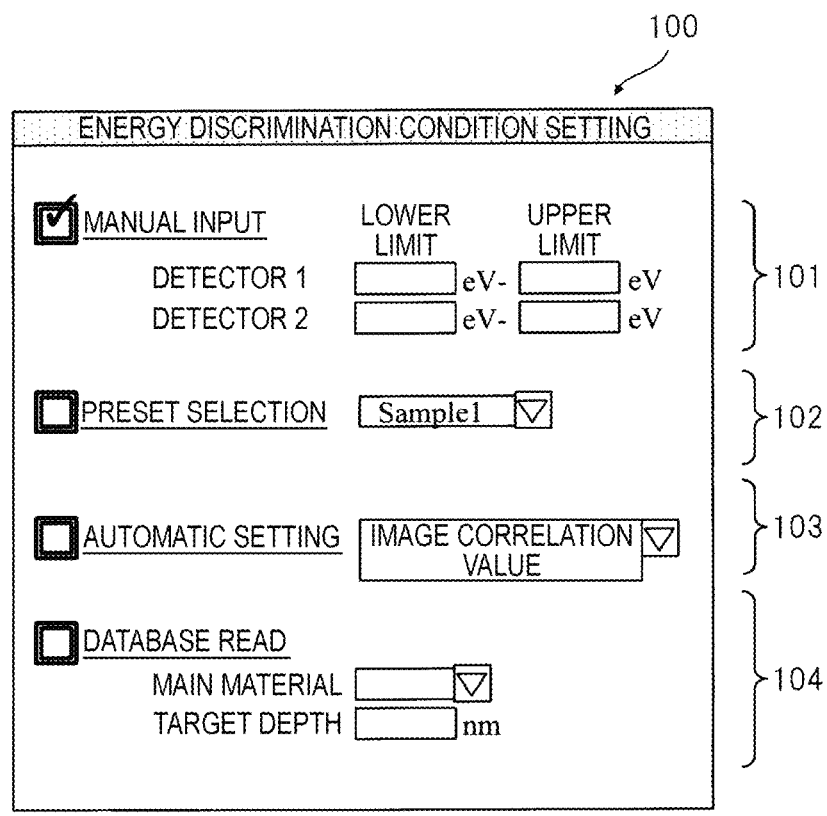

CHARGED PARTICLE BEAM DEVICE

TECHNICAL FIELD

The present invention relates to a charged particle beam device.

BACKGROUND ART

A scanning electron microscope, which is an aspect of a charged particle beam device, is a device for generating an image and a signal waveform, based on a signal electron obtained by irradiating a sample with an electron beam. Generally, a signal electron emitted with energy of 50 eV or less is referred to as a secondary electron, and a signal electron emitted with energy, which is greater than 50 eV and close to a primary electron beam, is referred to as a reflected electron.

The scanning electron microscope is used, for example, for evaluation and measurement of a semiconductor device. In order to improve yield during manufacturing of the semiconductor device, workmanship management of patterns such as a hole and a groove on a semiconductor substrate is performed between some of the plurality of manufacturing processes. For example, the evaluation of the semiconductor device is performed by the workmanship management of the patterns based on a measured value such as a width and the like of the pattern using the scanning electron microscope.

In recent years, a structure of the semiconductor device becomes finer and is designed based on 3D, such that a need from a customer such as a semiconductor device manufacturer and the like is diversified. For example, as a device structure is designed based on 3D, there is a need to measure a cross-sectional shape of the pattern on the semiconductor substrate.

One of the methods for measuring the cross-sectional shape using the scanning electron microscope is a method using a signal electron discriminated by energy. The signal electron includes information such as composition of a sample and a three-dimensional shape thereof. Therefore, various pieces of information such as a 3D structure of the sample and a difference in composition between a surface and a bottom of the sample can be obtained from the signal electron. Further, since the signal electron has high energy, the signal electron can escape from a hole or a groove by penetrating a side wall to the outside of the sample, thereby also being used to detect and measure a signal from a bottom of the hole and the groove.

Further, as the signal electron has a long distance for penetrating the inside of the side wall, an amount of energy loss of the signal electron becomes greater. Therefore, the signal electron with high energy has shape information on a surface and a shallow, part of the pattern, and the signal electron with low energy has a lot of shape information on a deep part of the pattern. Reflected electrons are discriminated and detected in a plurality of energy regions by using this property, thereby making it possible to estimate the cross-sectional shape of the pattern at a depth corresponding to each energy region.

For example, WO-A-2018/173242 (PTL 1) discloses a method for detecting a reflected electronic signal (a signal electron) by using a detection surface formed of a scintillator and an optical and electrical conversion element formed of Si-PM (silicon photomultiplier) and the like, and then performing energy discrimination of the reflected electronic signal on an arithmetic circuit.

CITATION LIST

Patent Literature

PTL 1: WO-A-2018/173242

SUMMARY OF INVENTION

Technical Problem

In order to discriminate a signal electron in a plurality energy regions, it is required to repeatedly emit an electron beam by changing energy discrimination conditions corresponding to the number of energy regions. However, this method causes an increase in the number of times of electron beam emission and emission time of the electron beam, such that throughput deteriorates.

Accordingly, an object of the present invention is to improve throughput by performing energy discrimination of a signal electron in a short time.

Solution to Problem

A summary of a representative invention of the inventions disclosed in this application s briefly described as follows.

A charged particle beam device according to a representative embodiment of the present invention includes: a plurality of detectors for detecting a signal particle emitted from a sample irradiated with a charged particle beam and converting the detected signal particle into an electrical signal; an energy discriminator provided for each detector and configured to discriminate the electrical signal according to energy of the signal particle; a discrimination control block for setting an energy discrimination condition of each of the energy discriminators; and an image calculation block for generating an image based on the discriminated electrical signal. The discrimination control block sets energy discrimination conditions different from each other among the plurality of energy discriminators.

Advantageous Effects of Invention

Effects obtained by a representative invention of the inventions disclosed in this application are briefly described as follows.

That is, according to a representative embodiment of the present invention, it is possible to improve throughput by performing energy discrimination of a signal electron in a short time.

BRIEF DESCRIPTION OF DRAWINGS

FIG. 1 is a schematic diagram showing an example of a configuration of a scanning electron microscope according to a first embodiment of the present invention.

FIGS. 2A and 2B are diagrams showing another configuration example of a detector.

FIG. 3 is a diagram showing a relationship between the number of generated photons in a scintillator and electron incident energy.

FIG. 4 is a diagram showing a processing procedure from signal electron detection to image generation according to the first embodiment of the present invention.

FIG. 5 is a diagram showing a relationship between an output value of an output electrical signal and time.

FIG. 6 is a diagram showing an example in which energy of a signal electron changes depending on an emission location of an electron beam.

FIG. 7 is a diagram showing a principle of the image generation.

FIG. 8 is a schematic diagram showing an example of a configuration of a scanning electron microscope according to a second embodiment of the present invention.

FIG. 9 is a diagram showing a processing procedure from signal electron detection to image generation according to the second embodiment of the present invention.

FIG. 10 is a flow chart showing an example of a method for setting an energy discrimination condition according to a third embodiment of the present invention.

FIG. 11 is a schematic diagram showing an example of a configuration of a scanning electron microscope according to a fourth embodiment of the present invention.

FIG. 12 is a diagram showing an example of user interface related to setting of the energy discrimination condition.

DESCRIPTION OF EMBODIMENTS

Hereinafter, embodiments of the present invention will be described with reference to the drawings. Each embodiment described hereinafter is an example for implementing the present invention, and does not limit the technical scope of the present invention. In the following, members having the same function will be denoted by the same reference signs in principle, and the repeated description thereof will be omitted unless otherwise required.

First Embodiment

<Configuration of Charged Particle Beam Device>

FIG. 1 is a schematic diagram showing an example of a configuration of a scanning electron microscope according to a first embodiment of the present invention. As shown in FIG. 1, a scanning electron microscope (a charged particle beam device) includes a scanning electron microscope lens barrel 1A and a signal processing block 1B.

As shown in FIG. 1, an electron source 2, a condenser lens 5, a deflector 4, an objective lens 6, a detector 7 (7a, 7b), and the like are disposed inside the scanning electron microscope lens barrel 1A. These components are sequentially disposed in a vertical direction from the upper electron source 2 to the lower detector 7. A stage, which is not shown, is disposed below the detector 7, and a sample 8, which is a target to be inspected, is placed on the stage.

The signal processing block 1B includes an energy discriminator 14 (14a, 14b), a discrimination control block 21, and an image calculation block 22. The energy discriminator 14 is provided for each detector 7. In FIG. 1, the energy discriminator 14a is provided corresponding to the detector 7a, and the energy discriminator 14b is provided correspondingly to the detector 7b, respectively.

The signal processing block 1B is connected to the scanning electron microscope lens barrel 1A, via an output cable 13 (13a, 13b). Specifically, the energy discriminator 14a is connected to an optical and electrical conversion element 12a of the detector 7a via the output cable 13a, and the energy discriminator 14b is connected to an optical and electrical conversion element 12b of the detector 7b via the output cable 13b. The energy discriminators 14a and 14b are connected to the discrimination control block 21 and the image calculation block 22. The discrimination control block 21 and the image calculation block 22 are connected to an input and output device 15.

The scanning electron microscope 1 is used in a state where the inside of the scanning electron microscope lens barrel 1A is evacuated. The electron source 2 irradiates the sample 8 with a primary electron beam (a charged particle beam and an electron beam) 3 in the scanning electron microscope lens barrel Lia in the vacuum state. Here, the first embodiment describes a case in which an electron is emitted as a charged particle, and a charged particle other than the electron may be used.

The condenser lens 5 and the objective lens 6 converge the diffused primary electron beam 3 on the sample 8. The deflector 4 scans the primary electron beam on the sample 8. The condenser lens 5, the objective lens 6, and the deflector 4 are disposed so as to surround a flight path of the primary electron beam. The condenser lens 5, the objective lens 6, and the deflector 4 may be configured in an annular shape in a plan view, or may be configured in such a manner that a plurality of arc-shaped blocks are sequentially disposed in a plan view.

When the primary electron beam 3 passing through the condenser lens 5, the objective lens 6, and the deflector 4 collides with the sample 8, a signal electron (a signal particle) 9 (9a, 9b) generated and emitted from the sample 8. The signal electron 9 flies in the scanning electron microscope lens barrel 1A depending on each emission energy and emission angle.

<Detector>

The detector 7 is a functional block that detects the signal electron 9 emitted from the sample 8. As shown in FIG. 1, the detector 7 includes a signal detection element 10 (10a, 10b), a light guide 11 (11a, 11b), and the optical and electrical conversion element 12 (12a, 12b). The signal detection element 10 is formed of, for example, scintillator. When the signal electron 9 collides with the signal detection element 10, the signal electron 9 is converted into light (a photon)) by the scintillator. The light converted by the scintillator is guided to the optical and electrical conversion element 12 by the light guide 11. The light guided to the optical and electrical conversion element 12 is converted into an output electrical signal (an electrical signal) 17 (17a, 17b) by the optical and electrical conversion element 12. The output electrical signal 17 converted by the optical and electrical conversion element 12 is supplied to the energy discriminator 14 (14a, 14b) of the signal processing block 1B via the output cable 13.

FIG. 1 shows an example in which two detectors 7 (7a, 7b) are provided, and a configuration of the detector 7 is not limited thereto. FIGS. 2A and 2B are diagrams showing another configuration example of the detector. FIG. 2A shows an example in which the detector 7 is divided into four parts. The detector 7 of FIG. 2A has a configuration in which the signal detection element 10 is divided in a circumferential direction such as a polygon and a fan shape. Further, FIG. 2A shows a case in which a space is provided between the adjacent signal detection elements 10, and a shape without such a space may be formed. Specifically, when heights of the adjacent signal detection elements 10 are different and both signal detection elements 10 are disposed to overlap each other in a plan view, such a space can be eliminated. FIG. 2E shows a configuration in which the signal detection element 10 is divided into a plurality of regions in a radial direction. Specifically, the signal detection element 10 of FIG. 2B is divided into a plurality of ring shapes whose diameters are different from each other.

Further, in addition to the configurations of FIGS. 2A and 2B, the signal detection element 10 may be divided into a plurality of regions in the circumferential direction and the radial direction. FIG. 2A shows an example in which the signal detection element 10 is divided into four parts, and there is no limit to the number of signal detection elements 10 in FIGS. 2A and 2B.

Further, a connection method between the signal detection element 10 and the optical and electrical conversion element 12 in FIGS. 2A and 2B is only an example. For example, in the configuration of FIG. 1A, the optical and electrical conversion element 12 may be disposed in the space between the adjacent signal detection elements 10.

The detector 7 including the light guide 11 is shown in FIG. 1, and the optical and electrical conversion element 12 may be directly connected to the scintillator without providing the light guide 11. Further, the detector may be formed of a photodiode, Si-PM, and the like that directly convert the energy of the signal electron 9 into the electrical signal, in addition to a combination of the scintillator and the optical and electrical conversion element. Further, the detector 7 is disposed below the objective lens 6 in FIG. 1, and the detector 7 may be disposed above the objective lens 6 and the deflector 4.

<Energy Discriminator>

The energy discriminator 14 is a functional block that performs an energy discrimination process on the output electrical signal 17 supplied from the optical and electrical conversion element 12, based on the energy discrimination condition (for example, an energy threshold value) set by the discrimination control block 21. Specifically, the energy discriminator 14a performs the energy discrimination process on the output electrical signal 17a supplied from the optical and electrical conversion element 12a, and the energy discriminator 14b performs the energy discrimination process on the output electrical signal 17b supplied from the optical and electrical conversion element 12b. The energy discrimination process will be described in detail later.

The energy discriminator 14 is formed of hardware such as an arithmetic circuit and the like. Further, the energy discriminator 14 may be provided with a storage device that stores or temporarily stores the set energy discrimination condition, a discrimination calculation block that performs the energy discrimination process based on the energy discrimination condition, and the like.

The energy discriminator 14 may have any configuration as long as the energy discriminator 14 has a method for selectively classifying. The output electrical signal 17 by using the energy of the signal electron 9. FIG. 3 is a diagram showing a relationship between the number of generated photons in the electron energy. When the signal detection element 10 is formed of the scintillator, the number of generated photons changes depending on the energy of the signal electron 9 incident on the signal detection element 10 as shown in FIG. 3.

By using this property, the arithmetic circuit of the energy discriminator 14 may read an output value of the output electrical signal 17 and perform the energy discrimination process. In this case, when the scintillator forming the signal detection element 10 is a substance that emits light due to the incidence of the signal electron 9, for example, the scintillator may be a single crystal such as yttrium aluminate (YAP) and yttrium aluminum garnet (YAG), or may be a powder fluorescent body such as yttrium silicate ($y_2SiO_5$) classified as P47 in the JEDEC classification, a gallium nitride (GaN)-based multilayer thin film structure, and the like. Further, it is desirable that the optical and electrical conversion element 12 is formed of a photodiode (PD (particularly an avalanche photodiode: APD)) and Si-PM (silicon photomultiplier), which are semiconductor elements having a small fano factor. These optical and electrical conversion elements have small output variation and can accurately reflect the number of incident photons in the output value of the output electrical signal.

<Discrimination Control Block>

The discrimination control block 21 is a functional block that controls the energy discrimination condition for the energy discriminator 14. For example, the discrimination control block 21 sets the energy discrimination condition by supplying the energy discrimination condition input from the input and output device 15 to each energy discriminator 14.

<Image Calculation Block>

The image calculation block 22 is a functional block that generates an image based on the output electrical signals 17 output from the plurality of detectors 7. Specifically, the image calculation block 22 generates a desired image based on an energy discrimination processing result by each energy discriminator 14. The image generation process will be described in detail later.

The discrimination control block 21 and the image calculation block 22 may be configured by hardware or may be implemented by executing a program in a processor. In addition thereto, the discrimination control block 21 and the image calculation block 22 may be configured by an FPGA (Field-Programmable Gate Array) and the like, or may be implemented by a collaboration of hardware and software.

The input and output device 15 transmits the energy discrimination condition to the discrimination control block 21. This energy discrimination condition may be, for example, manually input by allowing a user to operate the input and output device 15, or may be stored in a storage device which is not shown by presetting a predetermined threshold value associated with the sample 8 to be observed in advance. Further, the input and output device 15 receives image data of the image generated by the image calculation block 22 and displays the image on a display 15a. The input and output device 15 may store the received image data in a storage device or may output the received image data to an external device. As the input and output device 15, an information processing device such as a personal computer can be used.

<Processing Procedure from Signal Electron Detection to Image Generation>

FIG. 4 is a diagram showing a processing procedure from signal electron detection to image generation according to the first embodiment of the present invention. When the signal electron 9a generated from the sample 8 collides with the signal detection element 10a, a number of photons corresponding to an energy value of the signal electron 9a are emitted. The emitted photons 16a are guided by the light guide 11a of FIG. 1 and converted into the output electrical signal 17a according to the number of photons in the optical and electrical conversion element 12a. In the energy discriminator 14a, an electrical signal satisfying the set energy discrimination condition (the energy threshold value) is extracted from the output electrical signal 17a and discriminated. The energy discriminator 14a converts the discriminated electrical signal into an image gradation value 19a at a predetermined frequency per unit time. That is, the energy discriminator 14a generates the image gradation value 19a based on the discriminated electrical signal.

On the other hand, when the signal electron 9b generated from the sample 8 collides with the signal detection element 10b in a region different from that of the signal detection element 10a, an electrical signal according to the energy threshold value set by the energy discriminator 14b is extracted from the output electrical signal 17a through the same processing procedure. The extracted electrical signal is converted into an image gradation value 19b at a predetermined frequency per unit time. Here, the energy threshold value of the energy discriminator 14a and the energy threshold value of the energy discriminator 14b are set so as to be different values among the plurality of energy discriminators 14.

Next, the image gradation values 19a and 19b converted by the respective energy discriminators 14a and 14b are supplied in parallel to the image calculation block 22 as contrast images different from each other. Such signal electron detection is performed while scanning the primary electron beam with the deflector 4, and the image gradation value for each energy discriminator at each location in a predetermined inspection region of the sample 8 can be obtained.

The image calculation block 22 performs a comparison calculation on the different contrast images supplied in parallel, and calculates an image gradation value after performing the comparison calculation at each location in the inspection region. The image calculation block 22 generates image data of the image 20 based on the image gradation value of each location. The generated image data is supplied to the input and output device 15, and the image 20 is displayed on the input and output device 15.

<Specific Example of Energy Discrimination Method>

FIG. 5 is a diagram showing a relationship between an output value of an output electrical signal and time. As shown in FIG. 5, the output electrical signal 17 is a pulse having various output values. The energy discriminator 14 selects and extracts, among these output electrical signals, an output electrical signal having a value higher than the energy threshold value set by the discrimination control block 21, or an output electrical signal having an output lower than the energy threshold value set by the discrimination control block 21, thereby performing the energy discrimination process.

Further, the energy discrimination process may be performed by another method. For example, the energy discriminator 14 can discriminate the output electrical signal 17 by using the output value of the output electrical signal 17 and detection time of the signal electron 9. Specifically, when it is possible to measure the detection time from the emission of the electron beam from the electron source 2 to the detection of the signal electron 9 by the signal detect on element 10, the arithmetic circuit of the energy discriminator 14 can perform the energy discrimination process by reading the detection time according to the energy (that is, a speed) of the signal electron 9. In this case, the output electrical signal 17 is generated as a pulse at various times, and the energy discrimination is performed by selecting and extracting, among those output electrical signals, an output electrical signal having a time shorter than a detection time threshold value set by the discrimination control block 21 or an output electrical signal having a time longer than the detection time threshold value. For example, a counter circuit, a timer circuit, and the like can be used for the measurement of the detection time.

<Specific Example of Image Generation Method Using Signal after Energy Discrimination>

By performing the energy discrimination process under a plurality of energy discrimination conditions (the energy threshold value, the detection time threshold value, and the like), a plurality of image gradation values 19 for the same location can be obtained. By performing an arithmetic process using the plurality of image gradation values 19 in the image calculation block 22, an observation target pattern of the sample 8 can be partially emphasized, and various patterns can be measured.

FIG. 6 is a diagram showing an example in which the energy of the signal electron changes depending on an emission location of the electron beam. FIG. 6 shows a method for generating an image of a surface 1001 and an image of a bottom surface 1002 of a hole pattern formed on the sample 8.

When the surface 1001 and the bottom surface 1002 of the hole pattern are irradiated with the electron beam under the same condition, an electron having energy E2 is reflected as a signal electron from the surface 1001 and the bottom surface 1002. However, a signal electron 1004 reflected from the bottom surface 1002 penetrates a part of the sample 8 and then is detected by the detector 7. Therefore, energy E1 of the signal electron 1004 penetrating a part of the sample 8 is reduced by $\Delta E$ (E1=E2−$\Delta E$) in comparison with the energy E2 of a signal electron 1003 emitted from the surface 1001. By using such characteristics, the image calculation block 22 can generate an image in which a specific part of a pattern such as a hole pattern and the like is emphasized.

FIG. 7 is a diagram showing a principle of the image generation. If the number of photons is m when the energy of the signal electron 9 is E1, and the number of photons is n when the energy of the signal electron 9 is E2, both are discriminated by a predetermined energy threshold value Th. As shown in FIG. 7, by extracting a signal having the predetermined energy threshold value Th or greater, it is possible to selectively extract a region in which the energy of the signal electron 9 is E in a visual field (an inspection region). Since a large amount of the signal electrons 9 having the energy E2 are emitted from the surface 1001 of the sample 8, an image generated based on the signal electron 9 having the energy E2 significantly reflects information on the surface 1001 of the sample 8.

Further, an output electrical signal based on the signal electron having another energy, that is, a signal (B) in which an output electrical signal smaller than the energy threshold value Th is deleted becomes an image that more significantly reflects the information on the surface 1001 of the sample 8.

On the other hand, an image generated based on the signal electron 9 having the energy E1 significantly reflects information on the bottom surface 1002 of the sample 8. Therefore, the signal (B) that significantly reflects the information on the surface 1001 is subtracted from the signal (A) that significantly reflects the information on the bottom surface 1002, thereby making it possible to generate an image in which the bottom surface 1002 is emphasized. At that time, by excluding an output electrical signal that exceeds the energy threshold value Th, a process of relatively emphasizing information on a lower layer side may be performed.

FIG. 7 shows a case in which the signal electron is discriminated in two regions by using one energy threshold value Th, and the embodiment is not limited to this case. For example, when a three-dimensional structure of the sample 8 including a pattern having at least three different heights of an upper layer, a middle layer, and a lower layer becomes an evaluation target, it is considered that as the pattern is deeper, a degree of attenuation of the energy of the reflected electron is greater. Therefore, by setting a first energy threshold value Th1 for discriminating between the upper layer and the middle layer and a second energy threshold value Th2 for discriminating between the middle layer and the lower layer, it is possible to perform a subtraction process of emphasizing a layer desired to be particularly emphasized.

Here, the first embodiment describes a method for generating an image by performing an emphasis process at high and low energies of the signal electron 9, and it is also possible to extract an output electrical signal corresponding to energy within a predetermined range between two threshold values. Therefore, it is possible to generate an image after each process of high-pass, low-pass, and band-pass is performed on the energy of the signal electron 9.

Main Effects of the Embodiment

According to the embodiment, the energy discriminator 14 is provided for each of the plurality of detectors 7, and different energy discrimination conditions are set among the plurality of energy discriminators 14. According to this configuration, since a contrast image in a different energy range can be obtained by emitting the electron beam once, the energy discrimination of the signal electron is performed in a short time, thereby making it possible to improve throughput. Specifically, without repeatedly emitting the electron beam while changing the energy threshold value, it is possible to obtain the image gradation value, which is generated by discriminating the output electrical signal 17 at a plurality of energy threshold values according to the number of divisions of the signal detection element 10 (the number of divided signal detection elements 10) and using the output electrical signal after the discrimination, by emitting the electron beam once. Further, it is possible to speed up estimation of a cross-sectional shape using the output electrical signal at the plurality of energy threshold values and the image gradation value.

Further, according to the embodiment, the anal detection element 10 is divided into a plurality of regions in the circumferential direction. Further, the signal detection element 10 is divided into a plurality of regions in the radial direction. Further, the signal detection element 10 is divided into a plurality of regions in the circumferential direction and the radial direction. According to these configurations, it is possible to efficiently dispose a plurality of signal detection elements 10 with respect to the flight path of signal electron.

Further, according to the embodiment, the detector 7 is formed of the photodiode or the silicon photomultiplier. According to this configuration, since the signal electron can be directly converted into the output electrical signal 17, conversion efficiency and detection sensitivity can be improved.

Further, according to the embodiment, the signal detection element 10 is a scintillator. According to this configuration, since the scintillator is inexpensive and easily available, the cost required for the signal detection element 10 can be reduced.

Further, according to the embodiment, the optical and electrical conversion element 12 is formed of the photodiode or the silicon photomultiplier. Since the output variations of the photodiode and the silicon photomultiplier are small, the number of incident photons can be accurately reflected in the output value of the output electrical signal.

Further, according to the embodiment, the energy discriminator 14 discriminates the electrical signal by using the output value of the output electrical signal 17 and the detection time of the signal electron 9. According to this configuration, the arithmetic circuit of the energy discriminator 14 can perform the energy discrimination process by reading the detection time according to the speed of the signal electron 9.

Further, according to the embodiment, a plurality of image gradation values are supplied in parallel to the image calculation block 22. According to this configuration, the time from the detection of the signal electron 9 to the generation of the image is shortened.

Second Embodiment

Next, a second embodiment will be described. In the above-described embodiment, the arithmetic circuit of the energy discriminator 14 performs the energy discrimination process of the output electrical signal 17. On the other hand, the energy discriminator may have any configuration as long as the energy discriminator can perform the energy discrimination process according to the energy of the signal electron. Here, the second embodiment describes a method for performing the energy discrimination of the signal electron 9 before the signal electron 9 is detected by the detector 7.

FIG. 8 is a schematic diagram showing an example of a configuration of a scanning electron microscope according to the second embodiment of the present invention. In the scanning electron microscope 1 of FIG. 8, an energy filter 114 (114a, 114b) serving as an energy discriminator is disposed between the sample 8 and the signal detection element 10. The energy filter 114 is connected to the discrimination control block 21, and an energy threshold value is set from the discrimination control block 21. An energy threshold value of the energy filter 114a and an energy threshold value of the energy filter 114b are set to be values different from each other.

The energy filter 114 may have any configuration as long as the energy filter 114 has a method for selectively detecting the energy of the signal electron 9. As the energy filter 114, for example, a mesh shaped electrode that decelerates and repels the signal electron may be used, or an orbit of the signal electron 9 may be selected by applying an electrical field and a magnetic field laterally to the orbit of the signal electron.

Instead of the energy filter 114, for example, by changing a film thickness of the scintillator forming the signal detection element 10 for each detector 7, the signal detection element 10 may have a function as the energy discriminator. Accordingly, it is possible to perform the energy discrimination according to the film thickness of each detector.

On the other hand, the signal processing block 1B includes a gradation value calculation circuit 115 (115a, 115b) instead of the energy discriminator 14 of FIG. 1. The gradation value calculation circuit 115a is connected to the optical and electrical conversion element 12a of the detector 7a via the output cable 13a, and the gradation value calculation circuit 115b is connected to the optical and electrical conversion element 12b of the detector 7b via the output cable 13b. The gradation value calculation circuit 115 is provided corresponding to each detector 7. Further, the gradation value calculation circuit 115 is connected to the image calculation block 22. The gradation value calculation circuit 115 calculates the image gradation value 19 based on the output electrical signal 17 output from the optical and electrical conversion element 12.

FIG. 9 is a diagram showing a processing procedure from signal electron detection to image generation according to the second embodiment of the present invention. Among the signal electrons 9*a* generated from the sample 8, only the signal electron according to the set energy threshold value is discriminated, and then the discriminated signal electron passes through the energy filter 114*a*. When the signal electron passing through the energy filter 114*a* collides with the signal detection element 10*a*, a photon 16*a* is emitted. The emitted photon 16*a* is guided by the light guide lie and converted into the output electrical signal 17*a* according to the number of photons by the optical and electrical conversion element 12*a*. The output electrical signal 17*a* is based on the signal electron after the energy discrimination. The gradation value calculation circuit 115*a* converts the output electrical signal 17*a* into the image gradation value 19*a* at a frequency per unit time.

On the other hand, the signal electron 9*b* generated from the sample 8 is discriminated by the energy filter 114*b*, and then collides with the signal detection element 10*a*. Hereinafter, through the same process, the gradation value calculation circuit 115*b* converts the output electrical signal 17*b* into the image gradation value 19*b* at a frequency per unit time.

Next, the image gradation value 19*a* and the image gradation value 19*b* are supplied in parallel to the image calculation block 22. The image calculation block 22 generates an image by using the supplied image gradation value 19*a* and image gradation value 19*b*. That is, in the second embodiment, the image calculation block 22 generates the image based on the output electrical signals 17*a* and 17*b* output from the optical and electrical conversion elements 12*a* and 12*b*.

According to the embodiment, the energy discriminator is formed of the energy filter 114. According to this configuration, since only the signal electron 9 after the energy discrimination collides with the detector 7, it may not be required to discriminate the output electrical signal 17. Therefore, a circuit configuration of the signal processing block 1B is simplified, such that the time until the image generation is shortened.

Third Embodiment

Next, a third embodiment will be described. The third embodiment describes a method for setting an energy discrimination condition by using an image evaluation value. A device configuration according to the third embodiment is the same as that of FIGS. 1 and 8.

In order to obtain information on a shape and a material of the sample 8, which is a target to be observed, from a plurality of images obtained by using a plurality of detectors, it is desirable that there is little information overlapping between the plurality of images, that is, contrasts of the images are different between the images. Here, the third embodiment describes a method for deriving the energy discrimination condition by using, as the image evaluation value, a degree of similarity between the images obtained by using the plurality of detectors.

Hereinafter, an example of a sequence from deriving the energy discrimination condition by using the degree of similarity to setting will be described with reference to the drawings. FIG. 10 is a flow chart showing an example of a method for setting the energy discrimination condition according to the third embodiment of the present invention. FIG. 10 includes steps S10 to S70.

First, in step S10, a of the energy discrimination conditions is created. The discrimination control block 21 creates a list of the energy discrimination conditions E={$E_1$, $E_2$, $E_3$, . . . } using the energy discrimination condition input from a user by the input and output device 15 or the energy discrimination condition stored in advance in a storage device which is not shown.

For example, the user inputs a lower limit value and an upper limit value of the energy threshold value, and a step size of the energy threshold value as the energy discrimination conditions, such that the discrimination control block 21 may create the list of the energy discrimination conditions while automatically complementing the energy threshold value between the lower limit value and the upper limit value.

Next, in step S20, image capturing is repeatedly performed to cover the list of the energy discrimination conditions E. At this time, the same energy discrimination condition may be set for all the energy discriminators, or energy discrimination conditions different from each other may be set therefor. When the energy discrimination conditions different from each other are set, the number of times of image capturing required to cover the list E can be reduced and the time can be shortened.

Next, the image calculation block 22 creates a list of the captured images I={$I_1$, $I_2$, $I_3$, . . . } corresponding to the list of the energy discrimination conditions E (step S30), and creates a combination list of the captured images $I_{sub}$={{$I_1$, $I_2$}, {$I_1$, $I_3$}, {$I_2$, $I_3$}, . . . } according to the number of detectors from the list of the captured images I (step S40).

In this specification and FIG. 10, the combination list $I_{sub}$ assuming the case of two detectors is shown, and the number of detectors is not limited. For example, the combination list when the number of detectors is three is $I_{sub}$={{$I_1$, $I_2$, $I_3$}, {$I_1$, $I_2$, $I_4$}, {$I_1$, $I_3$, $I_4$}, {$I_2$, $I_3$, $I_4$}, . . . }.

Next, in step S50, the degree of similarity is calculated for each combination of images included in the combination list $I_{sub}$. The image calculation block 22 calculates the degree of similarity for each combination of images according to the number of detectors, and creates a list of the degrees of similarities S={$S_{12}$, $S_{13}$, $S_{23}$, . . . } listing the degree of similarity in each combination. An example of the degree of similarity includes a correlation value between a plurality of (for example, two) images.

When the number of detectors is three or more, the image calculation block 22 calculates the correlation value for all combinations of the two images {{$I_i$, $I_j$}, {$I_i$, $I_k$} {$I_j$, $I_k$}, . . . } with respect to each element of the combination list $I_{sub}$ {$I_i$, $I_j$, $I_k$, . . . } (I, j, and k are integers), and may adopt the largest one of these correlation values as the degree of similarity $S_{ijk}$.

Next, in step S60, the image calculation block 22 derives a combination of images {$I_i$, $I_j$} having the minimum degree of similarity $S_{ij}$ and a combination of corresponding energy discrimination conditions {$E_i$, $E_j$}.

Next, in step S70, the discrimination control block sets the combination of the energy discrimination conditions {$E_i$, $E_j$} derived in step S60 in each energy discriminator.

According to the embodiment, the image calculation block 22 derives the energy discrimination condition by using the degree of similarity between the images obtained by using the plurality of detectors 7 as the image evaluation value. Specifically, the image calculation block 22 calculates the degree of similarity between the images for all combinations of the detectors 7, and derives the combination of the images having the minimum degree of similarity and the corresponding energy discrimination condition. According to this configuration, even when a plurality of detectors are used, it possible to automatically set the energy discrimination condition so that images having different contrasts can be obtained.

Fourth Embodiment

Neat, a fourth embodiment will be described. The fourth embodiment describes a method for setting an energy discrimination condition using a database.

FIG. 11 is a schematic diagram showing an example of a configuration of a scanning electron microscope according to the fourth embodiment of the present invention. FIG. 11 has a configuration is which a storage device 23 is added to the configuration of FIG. 1. The fourth embodiment can also be applied to the configuration of FIG. 8.

The storage device 23 stores in advance information on a depth, a material, and the like of an assumed observation target pattern for the sample 8, information on an emission condition such as an acceleration voltage and the like of the electron beam suitable for the observation target pattern, and a database of the energy discrimination condition of the energy discriminator (for example, an energy threshold value and the like).

A user of the input and output device 15 may set an appropriate value for the emission condition such as the acceleration voltage and the energy discrimination condition, or the emission condition and the energy discrimination condition may be set to a value such that an evaluation index value separately derived becomes the maximum or the minimum. Examples of the evaluation index value include the image evaluation value such as the degree of similarity between a plurality of images described in the third embodiment, and a measurement performance index such as reproducibility and sensitivity of a dimensional measurement value of the observation target pattern using an image.

When the electron beam is emitted, the discrimination control block 21 collates the information on the depth, the material, and the like of the observation target pattern input by the user with the database stored in the storage device 23, and automatically derives the acceleration voltage of the electron beam and the energy discrimination condition of each energy, discriminator. Next, the discrimination control block 21 sets the derived energy discrimination condition in each energy discriminator.

According to the fourth embodiment, the storage device stores information on the depth of the assumed observation target pattern of the sample 8 and the material of the assumed observation target pattern of the sample 8, the acceleration voltage of the electron beam, and the database of the energy discrimination condition. Further, the discrimination control block 21 sets the acceleration voltage of the charged particle beam and the energy discrimination condition of each energy discriminator by using the information on the depth of the observation target pattern of the sample 8 and the material of the observation target pattern of the sample 8 input by the user. According to this configuration, it is possible to automatically set the energy discrimination condition so that the image desired by the user can be obtained, based on the database of the energy discrimination condition stored in the storage device 23.

Fifth Embodiment

Next, a fifth embodiment will be described. The fifth embodiment describes a specific example of a user interface (an input screen) for setting an energy discrimination condition.

FIG. 12 is a diagram showing an example of a user interface related to setting of the energy discrimination condition. A user interface 100 is displayed, for example, on a display 15a of the input and output device 15. The user interface 100 of FIG. 12 includes a manual input field 101, a preset selection field 102, an automatic setting field 103, and a database read field 104. A user can set the energy discrimination condition and the like while referring to each field of a user interface GUI.

The manual input field 101 includes, for example, an input field for an upper limit value and a lower limit value of the energy threshold value for each detector. A configuration of the input fields in the case of two detectors is shown here, and there is no limit to the number of detectors. Therefore, the manual input field 101 includes the input fields for the energy discrimination conditions corresponding to the number of detectors.

The preset selection field 102 is used, for example, when calling preset data stored in the storage device 23. For example, the user can set the energy discrimination condition by selecting desired data from a pulldown list of the preset selection field 102.

When the automatic setting field 103 is selected, for example, the energy discrimination condition is automatically set based on the information such as the image correlation value and the like.

In the database read field 104, a material of the sample 8 and a depth of the pattern can be set.

According to the fifth embodiment, the user can designate each item required for inspection of the sample 8 while looking at the user interface 100.

The present invention is not limited to the above-described embodiments and includes various modifications. Further, it is possible to replace a part of a configuration of one embodiment with a configuration of another embodiment, and it is also possible to add the configuration of another embodiment to the configuration of one embodiment. Further, a part of the configuration of each embodiment can be added, deleted, and replaced by another configuration. Each member and a relative size described in the drawings are simplified and idealized to describe the present invention in an easy-to-understand manner, and may have a more complicated shape in implementation.

REFERENCE SIGNS LIST

1: scanning electron microscope
2: electron source
3: electron beam
4: deflector
5: condenser lens
6: objective lens
7: detector
8: sample
9: signal electron
10: signal detection element
11: light guide
12: optical and electrical conversion element
14, 114: energy discriminator
15 input and output device
16: emitted photon
17: output electrical signal
19: image gradation value
20: image 21: discrimination control block
22: image calculation block
23: storage device
100: user interface

The invention claimed is:

1. A charged particle beam device, comprising:
a plurality of detectors for detecting a signal particle emitted from a sample irradiated with a charged particle beam and converting the detected signal particle into an electrical signal;
an energy discriminator provided for each detector and configured to discriminate the electrical signal according to energy of the signal particle;
a discrimination control block for setting an energy discrimination condition of each of the energy discriminators;
and an image calculation block for generating an image based on the discriminated electrical signal, wherein the discrimination control block sets energy discrimination conditions different from each other among the plurality of energy discriminators,
wherein each of the energy discriminators generates an image gradation value based on the discriminated electrical signal, and the plurality of image gradation values are supplied in parallel to the image calculation block.

2. The charged particle beam device according to claim 1, wherein the detector includes a signal detection element that converts the signal particle into light, and an optical and electrical conversion element that converts the converted light into the electrical signal, and
the signal detection element is divided into a plurality of regions in a circumferential direction.

3. The charged particle beam device according to claim 1, wherein the detector includes a signal detection element that converts the signal particle into light, and an optical and electrical conversion element that converts the converted light into the electrical signal, and
the signal detection element is divided into a plurality of regions in a radial direction.

4. The charged particle beam device according to claim 1, wherein the detector includes a signal detection element that converts the signal particle into light, and an optical and electrical conversion element that converts the converted light into the electrical signal, and
the signal detection element is divided into a plurality of regions in a circumferential direction and a radial direction.

5. The charged particle beam device according to claim 1, wherein the detector is a photodiode or a silicon photomultiplier.

6. The charged particle beam device according to claim 1, wherein the detector includes a signal detection element that converts the signal particle into light, and an optical and electrical conversion element that converts the converted light into the electrical signal, and
the signal detection element is a scintillator.

7. The charged particle beam device according to claim 1, wherein the detector includes a signal detection element that converts the signal particle into light, and an optical and electrical conversion element that converts the converted light into the electrical signal, and
the optical and electrical conversion element is a photodiode or a silicon photomultiplier.

8. The charged particle beam device according to claim 1, wherein the energy discriminator discriminates the electrical signal by using an output value of the electrical signal and a detection time of the signal particle.

9. A charged particle beam device, comprising:
a plurality of detectors for detecting a signal particle emitted from a sample irradiated with a charged particle beam and converting the detected signal particle into an electrical signal;
an energy discriminator provided for each detector and configured to discriminate the electrical signal according to energy of the signal particle;
a discrimination control block for setting an energy discrimination condition of each of the energy discriminators; and
an image calculation block for generating an image based on the discriminated electrical signal, wherein the discrimination control block sets energy discrimination conditions different from each other among the plurality of energy discriminators,
wherein the image calculation block derives the energy discrimination condition by using, as an image evaluation value, a degree of similarity between images obtained by using the plurality of detectors.

10. The charged particle beam device according to claim 9,
wherein the image calculation block calculates the degree of similarity between images for all combinations of the detectors, and derives a combination of images having the minimum degree of similarity and the corresponding energy discrimination condition.

11. A charged particle beam device, comprising:
a plurality of detectors for detecting a signal particle emitted from a sample irradiated with a charged particle beam and converting the detected signal particle into an electrical signal;
an energy discriminator provided for each detector and configured to discriminate the electrical signal according to energy of the signal particle;
a discrimination control block for setting an energy discrimination condition of each of the energy discriminators;
an image calculation block for generating an image based on the discriminated electrical signal, wherein the discrimination control block sets energy discrimination conditions different from each other among the plurality of energy discriminators; and
a storage device for storing information on a depth of an assumed observation target pattern of the sample and a material of the assumed observation target pattern of the sample, an acceleration voltage of the charged particle beam, and a database of the energy discrimination condition.

12. The charged particle beam device according to claim 11, wherein the discrimination control block sets the acceleration voltage of the charged particle beam and the energy discrimination condition of each of the energy discriminators by using the information on the depth of the observation target pattern of the sample and the material of the observation target pattern of the sample input by a user.

13. A charged particle beam device, comprising:
a plurality of detectors for detecting a signal particle emitted from a sample irradiated with a charged particle beam and converting the detected signal particle into an electrical signal;
an energy discriminator provided for each detector and configured to discriminate the signal particle according to energy;
a discrimination control block for setting an energy discrimination condition of each of the energy discriminators;

and an image calculation block for generating an image based on the electrical signal, wherein the discrimination control block sets energy discrimination conditions different from each other among the plurality of energy discriminators, wherein the image calculation block derives the energy discrimination condition by using, as an image evaluation value, a degree of similarity between images obtained by using the plurality of detectors.

14. The charged particle beam device according to claim 13, wherein the energy discriminator is an energy filter.

15. The charged particle beam device according to claim 13, wherein the image calculation block calculates the degree of similarity between images for all combinations of the detectors, and derives a combination of images having the minimum degree of similarity and the corresponding energy discrimination condition.

* * * * *